(12) United States Patent
Dokumaci et al.

(10) Patent No.: US 7,859,061 B2
(45) Date of Patent: Dec. 28, 2010

(54) HALO-FIRST ULTRA-THIN SOI FET FOR SUPERIOR SHORT CHANNEL CONTROL

(75) Inventors: Omer H. Dokumaci, Hartsdale, NY (US); John M. Hergenrother, Ridgefield, CT (US); Shreesh Narasimha, Beacon, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/538,111

(22) Filed: Aug. 8, 2009

(65) Prior Publication Data

US 2009/0294854 A1 Dec. 3, 2009

Related U.S. Application Data

(62) Division of application No. 11/753,862, filed on May 25, 2007, now Pat. No. 7,595,247.

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .............. 257/369; 257/382; 257/E27.062
(58) Field of Classification Search .............. 257/369, 257/377, 382, 388, E27.06, E27.062
See application file for complete search history.

(56) References Cited

U.S. PATENT DOCUMENTS

| 6,548,875 B2 * | 4/2003 | Nishiyama ............. 257/377 |
| 6,746,926 B1 | 6/2004 | Yu |
| 6,914,303 B2 | 7/2005 | Doris et al. |
| 7,060,546 B2 | 6/2006 | Hsu et al. |

* cited by examiner

*Primary Examiner*—Hoai v Pham
(74) *Attorney, Agent, or Firm*—Scully, Scott, Murphy & Presser, P.C.; Vazken Alexanian

(57) ABSTRACT

Superior control of short-channel effects for an ultra-thin semiconductor-on-insulator field effect transistor (UTSOI-FET) is obtained by performing a halo implantation immediately after a gate reoxidation step. An offset is then formed and thereafter an extension implantation process is performed. This sequence of processing steps ensures that the halo implant is laterally separated from the extension implant by the width of the offset spacer. This construction produces equivalent or far superior short channel performance compared to conventional UTSOI-FETs. Additionally, the above processing steps permit the use of lower halo doses as compared to conventional processes.

9 Claims, 12 Drawing Sheets

HALO-FIRST ULTRA-THIN SOI FET FOR SUPERIOR SHORT CHANNEL CONTROL

CROSS-REFERENCE TO RELATED APPLICATIONS

This application is a divisional of U.S. patent application Ser. No. 11/753,862, filed May 25, 2007.

The present invention relates to a semiconductor structure and a method of fabricating the same. More particularly, the present invention relates to an ultra-thin semiconductor-on-insulator field effect transistor (UTSOI-FET) structure in which the short channel effects are controlled. The present invention also relates to a method of forming such an UTSOI structure.

BACKGROUND

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device.

The latest technologies for fabricating integrated circuits (or ICs) using "semiconductor-on-insulator" (or SOI) substrates have propelled semiconductor technology ahead for another generation or two of scaling. These SOI-based technologies accomplish this by balancing more expensive SOI wafer substrates with more advanced lithographic patterning tools and techniques. Integrated MOS devices based on thinner SOI substrates provide fully depleted transistor bodies, effectively eliminating undesirable floating body effects. Accordingly, there is a trend in the semiconductor industry towards ultra-thin MOS devices based upon ever-thinner SOI substrates. The term "ultra-thin SOI" denotes an active semiconductor layer of an SOI substrate having a thickness of about 20 nm or less.

Another advantage of using ultra-thin SOI substrates is that they permit the body regions of MOS devices to experience a "strain" condition such that carrier mobility (both electrons and holes) is enhanced. The thinner the active semiconductor layer of the SOI substrate becomes, the greater the strain applied to it by stressed overlayers (stress silicon nitrides being typically used in the art).

Ultra-thin SOI channel devices also provide a sharper subthreshold slope (measure of the abruptness of the switching of the device), and better short channel effect control than semiconductor-on-insulator devices having a conventional thick channel. However, control of short channel effects with halo doping is complicated by the geometry of a conventional UTSOI device.

One solution to the aforementioned problem is to increase the dosage of the halo implant. This approach however has two main problems. The first problem with this prior art approach is that the required halo doses substantially compete with the extension implant doses and thus begin to compensate the extension implant. The second problem is that an increased halo dosage reduces the drive current of the device as well as the mobility of electrons and/or holes within the device channel.

In view of the above, there is a need for providing a new and improved method of fabricating an UTSOI device in which the short channel effects can be controlled yet avoiding/circumventing the problems with the halo implants mentioned above.

BRIEF SUMMARY

The present invention provides a method which obviates/circumvents the problems with prior art methods of forming UTSOI-FET devices. The prior art problems are obviated/circumvented by performing the halo ion implant immediately after forming a patterned gate region, which may optionally include a gate passivation layer. Offset spacers are then formed and thereafter an extension ion implant is performed. By employing this sequence of processing steps, the halo implant is laterally separated from the extension by the offset spacer. The inventive method produces equivalent or superior short channel performance compared to UTSOI devices prepared by conventional techniques. Moreover, the halo doses are far less in the present invention and there is no competition between the halo implant region and the extension implant region, as is the case with prior art structures. That is, the inventive method provides a structure in which much less counter doping in the extension region is exhibited.

In general terms, the method of the present invention comprises:

forming a patterned gate stack atop a surface of an ultra-thin semiconductor-on-insulator (UTSOI) layer;
forming a disposable spacer on exposed vertical sidewalls of said patterned gate stack;
forming a raised source/drain region on an exposed first portion of said UTSOI layer;
removing said disposable spacer to expose a second portion of said UTSOI at a footprint of said patterned gate stack;
performing a halo ion implant into said exposed second portion of said UTSOI layer;
forming offset spacers on exposed sidewalls of said patterned gate stack and said raised source/drain region; and
performing an extension ion implant into said second portion of said UTSOI layer that is not protected by said offset spacers.

In some embodiments of the present invention, a source/drain ion implant is performed into the raised source/drain region following the formation of the raised source/drain region and prior to removing the disposable spacer. In such an embodiment, the method also further includes performing a source/drain ion implant into the raised source/drain region following the formation of the extension ion implant region. The method of this embodiment may also include removing the offset spacers prior to performing the source/drain ion implant and thereafter forming a silicide spacer on exposed sidewalls of the patterned gate region. The method of this embodiment may further include forming a silicide region on at least the raised source/drain region after silicide spacer formation.

In another embodiment of the present invention, the offset spacers are removed after performing the extension ion implant, a silicide spacer is then formed on exposed vertical sidewalls of the patterned gate stack, and thereafter a silicide is formed on at least the raised source/drain region.

In the method of present invention, the halo ion implant comprises implanting one of boron and arsenic into the exposed second portion of the UTSOI layer. When boron is used, it may be implanted at an angle of from about 30 to about 45° using a boron dosage of about $1\times10^{14}$ atoms/cm² or less and an energy of about 5 to about 25 keV. When arsenic is used, it may be implanted at an angle of from about 30 to about 45° using an arsenic dosage of about $5\times10^{13}$ atoms/cm² or less and an energy of about 5 to about 25 keV.

In some embodiments in which the UTSOI layer has a thickness of less than 20 nm, the halo ion implantation process is conducted at an angle of greater than 45°. This reduces the dosage of the implanted species required for halo formation.

In yet other embodiments of the present invention, a gate passivation layer is formed on exposed surfaces of at least the patterned gate stack prior to forming the disposable spacer.

In addition to the method described above, the present invention also provides a semiconductor structure, i.e., an UTSOI-FET structure, that comprises:

at least one patterned gate region located upon a surface of an ultra-thin semiconductor-on-insulator (UTSOI) layer, said UTSOI layer having a first portion that includes a raised source/drain region located thereon and a second portion in which an extension ion implant region, a halo implant region and a device channel are located, said halo implant region and said extension implant region are laterally separated from each other by a distance from about 3 to about 20 nm thereby minimizing counter-doping in said extension implant region.

DETAILED DESCRIPTION

The present invention, which provides an UTSOI-FET in which the short channel effects are substantially controlled and a method of fabricating the same, will now be described in greater detail by referring to the following discussion and drawings that accompany the present application. It is noted that the drawings of the present invention are provided for illustrative purposes and, as such, they are not drawn to scale.

As stated above, superior control of short-channel effects for an ultra-thin semiconductor-on-insulator field effect transistor (UTSOI-FET) is obtained in the present invention by performing a halo implant immediately after formation of a patterned gate stack that may optionally include a gate passivation layer. An offset spacer is then formed and thereafter an extension implant is performed. This sequence of processing steps ensures that the halo implant is laterally separated from the extension implant by the width of the offset spacer. This construction produces equivalent or far superior short channel performance compared to conventional UTSOI-FETs. Additionally, the above processing steps permit the use of lower halo doses as compared to conventional processes.

The aforementioned processing steps will now be described in greater detail by referring to FIGS. 1-9. In FIGS. 1-9, a single FET is shown by way of an example. Although the following description and drawings illustrate only a single FET, the present invention can be used in fabricating a plurality of FETs on a surface of an ultra-thin SOI layer. The plurality of FETs can be all n-FETs, all pFETs or a combination of nFETs and pFETs.

Figure 1:
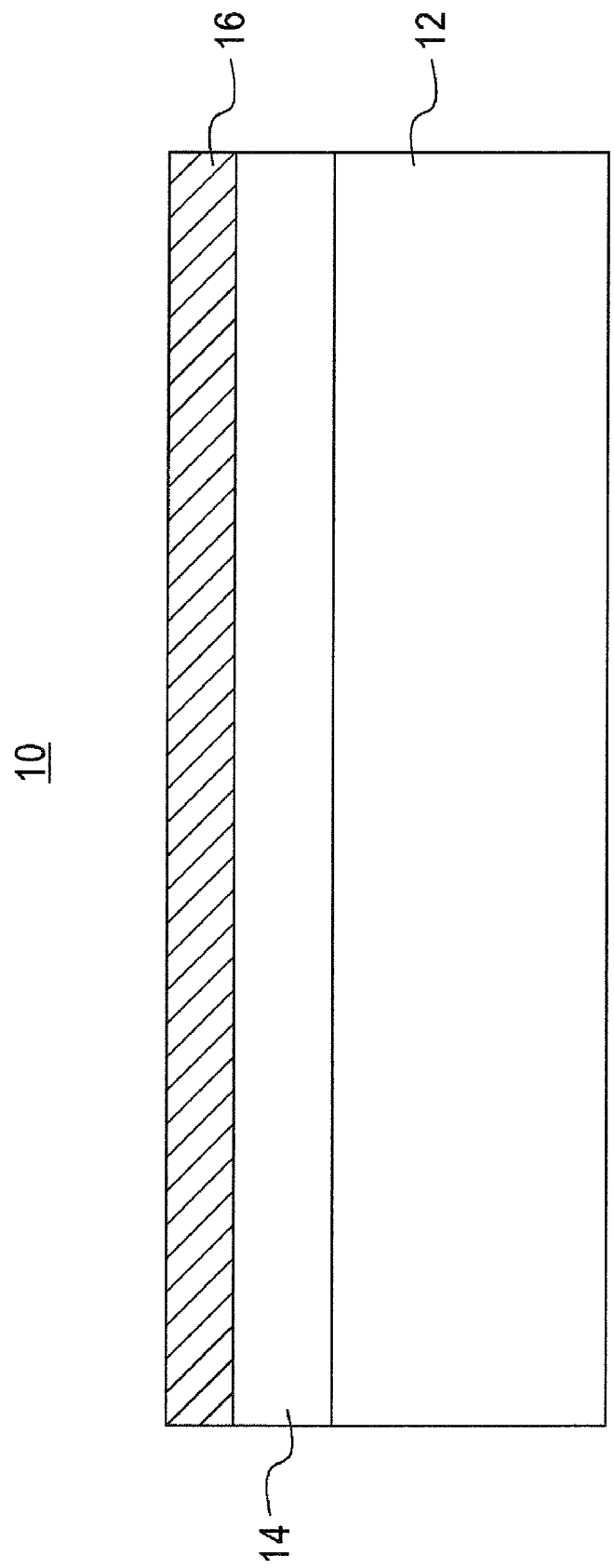
FIGS. 1-9 are pictorial representations (through cross sectional views) illustrating the basic processing steps that are employed in the present application.

Reference is formed made to FIG. 1 which illustrates a semiconductor-on-insulator (SOI) substrate 10 that can be employed in the present invention. The SOI substrate 10 includes a bottom semiconductor layer 12, a buried insulating 14 located on an upper surface of the bottom semiconductor layer 12 and a top, ultra-thin semiconductor layer (hereinafter UTSOI layer) 16 located on a surface of the buried insulator layer 14.

The SOI substrate 10 shown in FIG. 1 can be formed utilizing processing steps that are well known to those skilled in the art. For example, the SOI substrate 10 can be formed by a layer transfer process that includes a wafer-bonding step. Alternatively, the SOI substrate 10 can be formed by ion implantation of one of oxygen and nitrogen into a bulk semiconductor substrate.

The bottom semiconductor layer 12 and the UTSOI layer 16 may comprise the same or different semiconductor material including for example, Si, SiGe, SiC, SiGeC, Ge alloys, GaAs, InAs, InP, as well as other III-V or II-VI compound semiconductors. Each of the semiconductor layers (i.e., layers 12 and 16) within the SOI substrate 10 may comprise a layered semiconductor such as, for example Si/SiGe. Preferably, the bottom semiconductor layer 12 and the UTSOI layer 16 each comprise a Si-containing semiconductor, with Si being a most preferred material for both layers 12 and 16.

The bottom semiconductor layer 12 and the UTSOI layer 16 may comprise the same crystal orientation. Alternatively, the bottom semiconductor layer 12 and the UTSOI layer 16 may comprise different crystal orientations. Each semiconductor layer within the SOI substrate 10 may be strained, unstrained or a combination of strained and unstrained layers can be used.

The buried insulating layer 14 of the initial SOI substrate 10 may comprise a crystalline or non-crystalline oxide, nitride, oxynitride or any combination thereof. Preferably, the buried insulating layer 14 is an oxide, with thermal oxides being highly preferred.

The thickness of the various layers of the SOI substrate 10 are within ranges that are well known in the art of UTSOI device fabrication. For example, the thickness of the bottom semiconductor layer 12 is from about 25 to about 35 mils. The thickness of the buried insulating layer 14 is from about 50 to about 200 nm, while the thickness of the top UTSOI layer 16 is about 200 nm or less, with a thickness from about 7 to about 20 nm being more preferred for the UTSOI layer 16. It is noted that in instances when the SOI processing does not form a SOI substrate 10 having an UTSOI layer within the ranges mentioned above, an optional thinning process may be performed to thin the SOI layer to a thickness that is within the UTSOI range mentioned above.

If other FETs or other devices such as bipolar transistors are to be present, at least one isolation region such as a trench isolation region and/or a field oxide isolation region may be present and processed into the SOI substrate 10 utilizing techniques that are well known to those skilled in the art. In the drawings that follow, a single FET will be formed and as such no isolation regions are present.

Figure 2:
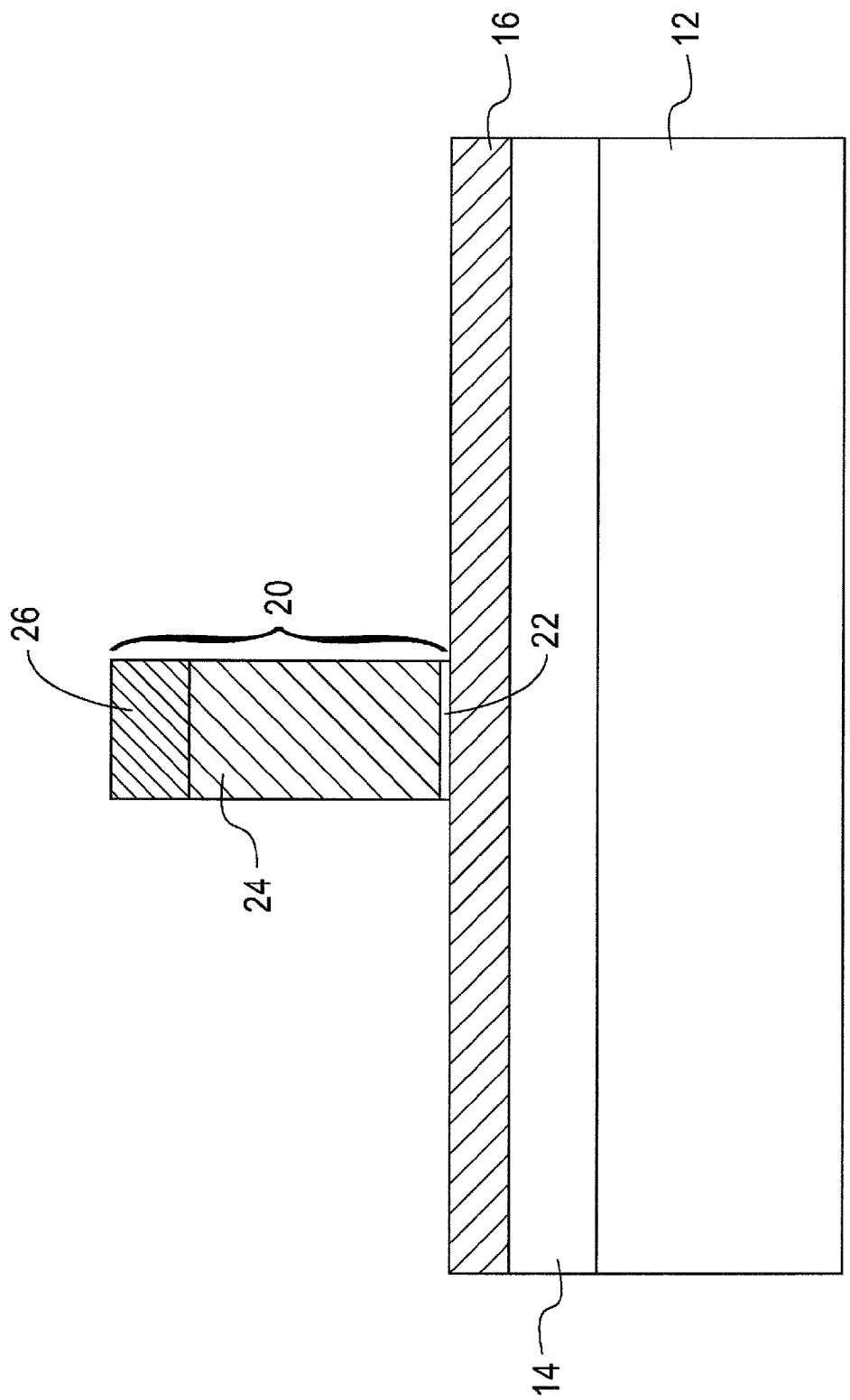

After providing the SOI substrate 10, a patterned gate stack 20 comprising, from bottom to top, a gate dielectric 22, a gate conductor 24, and an optional hard mask 26 is formed on a surface of the SOI substrate 10. The structure including the patterned gate stack 20 is shown in FIG. 2. The patterned gate stack 20 can be formed by conventional techniques well known those skilled in the art. For example, various deposition steps followed by lithography and etching may be used in forming the patterned gate stack 20. Alternatively, the patterned gate stack 20 can be formed utilizing a replacement gate process. Since both of these techniques are well known to those skilled in the art, details concerning each technique have been omitted so as not to obscure the present invention.

Notwithstanding which of the techniques are employed in forming the patterned gate stack 20, the gate dielectric 22 of the patterned gate stack 20 comprises any insulating material including, for example, oxides, nitrides, oxynitrides and combinations thereof. In some embodiments, the gate dielectric 22 is silicon oxide, silicon nitride, silicon oxynitride and multilayers thereof. In yet another embodiment, the gate dielectric 22 is a temperature sensitive high k dielectric material including, for example, $TiO_2$, $Al_2O_3$, $ZrO_2$, $HfO_2$, $Ta_5O_5$, $La_2O_3$ and perovskite-type oxides. Typically, the gate dielectric 22 comprises at least a layer of silicon oxide.

The gate conductor 24 of the patterned gate stack 20 is comprised of any conductive material including, for example, doped polysilicon, doped SiGe, a conductive elemental metal (such as W, Cu, Pt, Ag, Au, Ru, Ir, Rh and Re), alloys of the aforementioned elemental metals, silicides or nitrides that include at least one of the above-mentioned elemental metals, and multilayers thereof. Preferably, doped polysilicon is used as the gate conductor 24. When multilayers of various conductive materials are employed, an optional diffusion barrier (not shown) such as TaN or WN may be formed between the various conductive materials.

The hard mask 26 comprises an oxide, nitride, oxynitride, or multilayers thereof. Typically, the hard mask 26 comprises a nitride, with silicon nitride being highly preferred.

The thicknesses of the various layers that form the patterned gate stack 20 shown in FIG. 2 are within ranges that are conventional for CMOS technologies. Typically, and by way of example, the gate dielectric 22 has a thickness from about 1 to about 20 nm, the gate conductor 24 has a thickness from about 150 nm to about 500 nm, and the hard mask 26 has a thickness from about 20 to about 75 nm.

Figure 3:
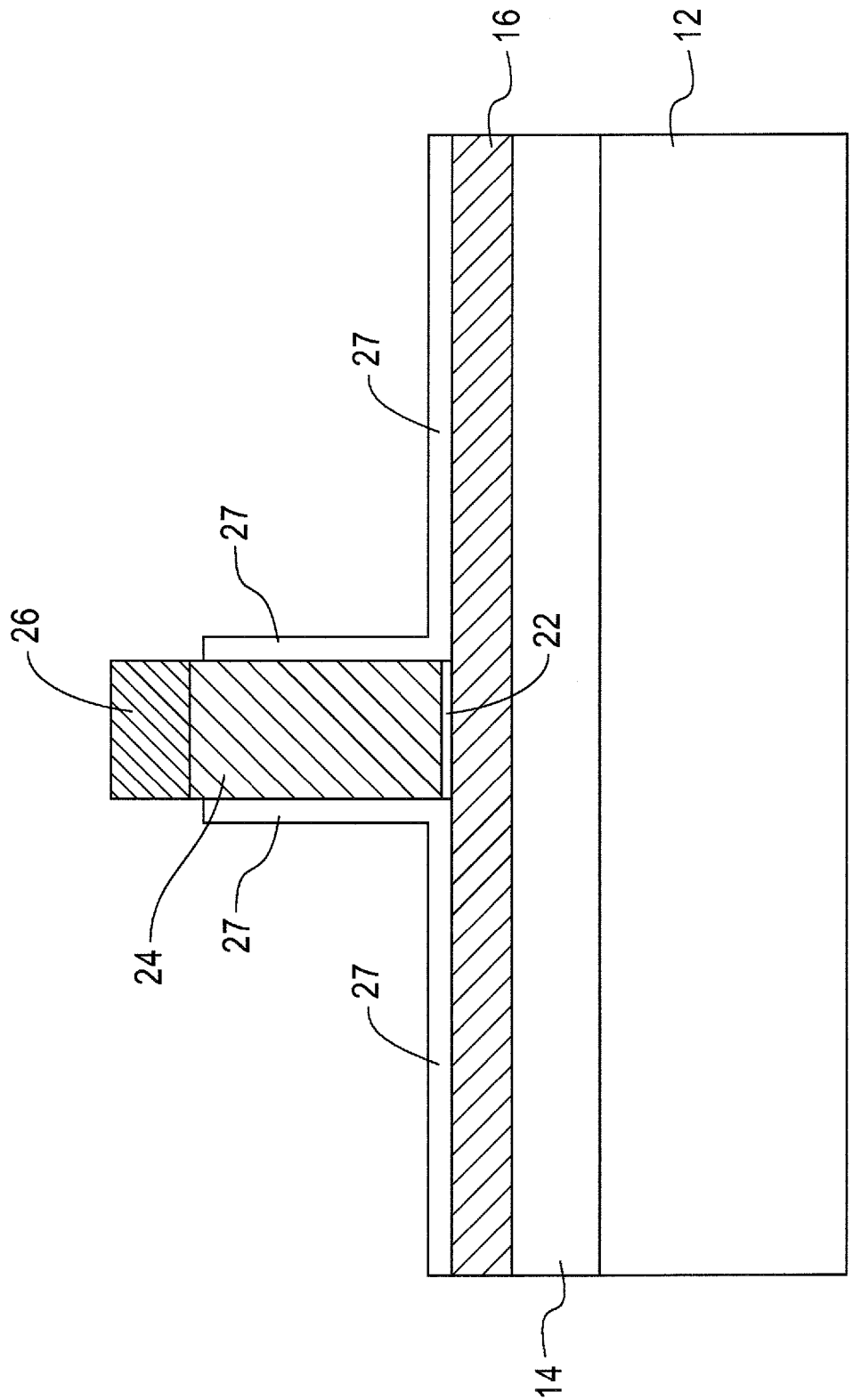

At this stage of the inventive process and optional oxide layer 27 is formed on the exposed surfaces of the SOI substrate 10 (i.e., atop the UTSOI layer 16) as well as the vertical sidewalls of the gate dielectric 22 and the gate conductor 24 providing the structure shown in FIG. 3. The optional oxide layer 27 is formed by either a conventional reoxidation process or by deposition including chemical vapor deposition, plasma enhanced chemical vapor deposition, atomic layer deposition and evaporation. The optional oxide layer has a thickness from about 1 to about 10, preferably from about 2 to about 5, nm. When an elemental metal is used as the gate conductor 24, the optional oxide layer 27 is typically not formed. Instead, and when an elemental metal is used as the gate conductor 24, an optional nitride layer is used in place of the optional oxide layer. The optional nitride layer typically has the same thickness as that of the optional oxide layer and the optional nitride layer can be formed by a thermal nitridation process or by deposition. The optional oxide layer and the optional nitride layer may be referred as a gate passivation layer.

Since the gate passivation layer is optional, the same is not shown in the remaining drawings of the present invention. It is, however, understood that the gate passivation layer can also be present and that the same may remain in the structure during the following processing steps without affecting the results of the inventive method.

Figure 4:
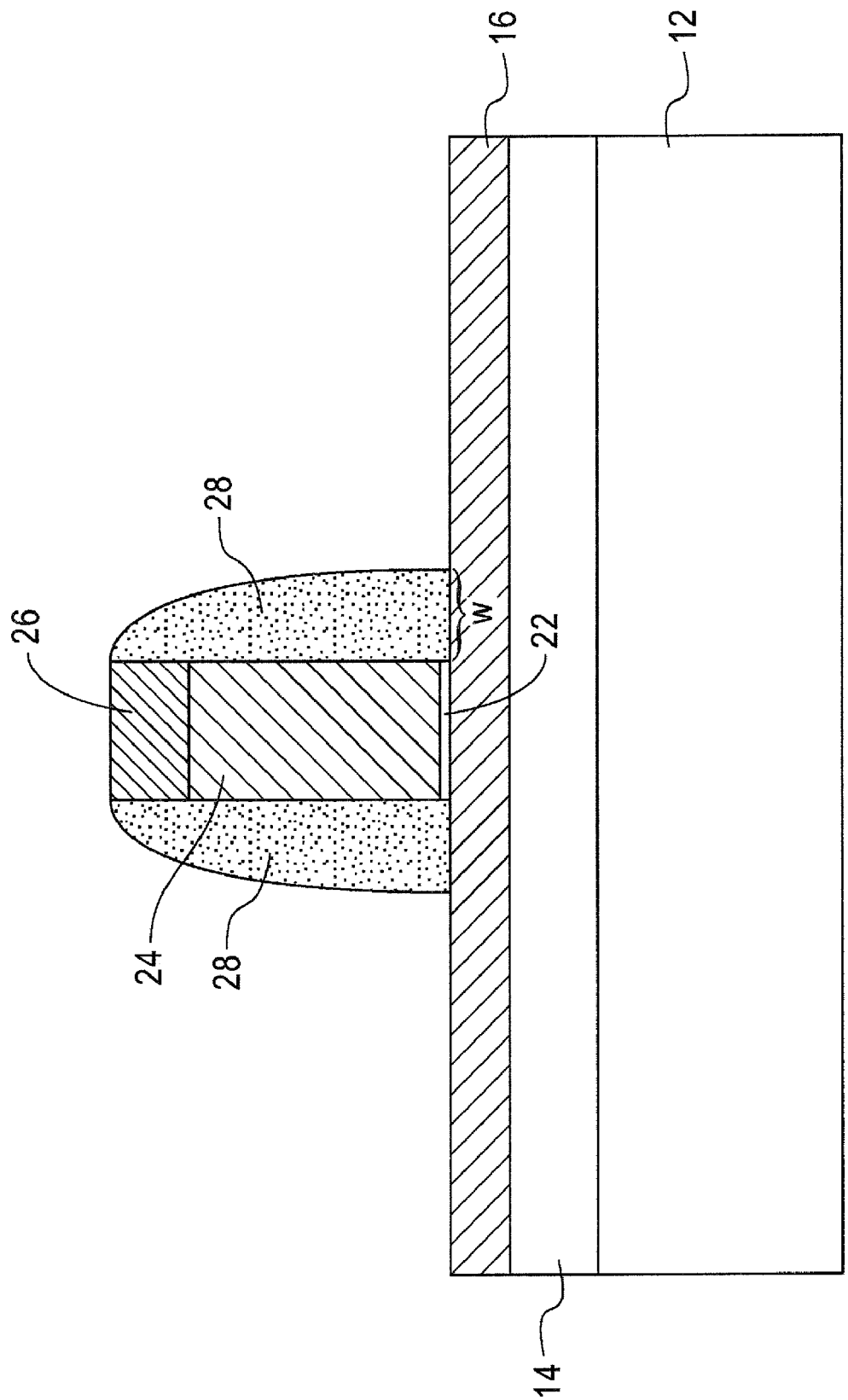

Next, and as shown in FIG. 4, a disposable spacer 28 is formed so as to laterally abut the vertical sidewalls of the patterned gate stack 20. If the optional gate passivation layer is present, the optional gate passivation layer would be located between an inner edge of the disposable spacer 28 and an outer edge of the patterned gate dielectric 22 and gate conductor 24. The disposable spacer 28 is comprised of any insulating material including for example, oxides, nitrides, oxynitrides and multilayers thereof. Preferably, the disposable spacer 28 is comprised of silicon nitride. The disposable spacer 28 is formed by deposition and etching. The etching step typically comprises a reactive ion etching process. The width of the disposable spacer 28 that is formed as measured along the bottom portion thereof, w, is typically from about 20 to about 50 nm. The disposable spacer 28 sets the lateral position of the raised source/drain (RSD) region to be subsequently formed.

Figure 5:
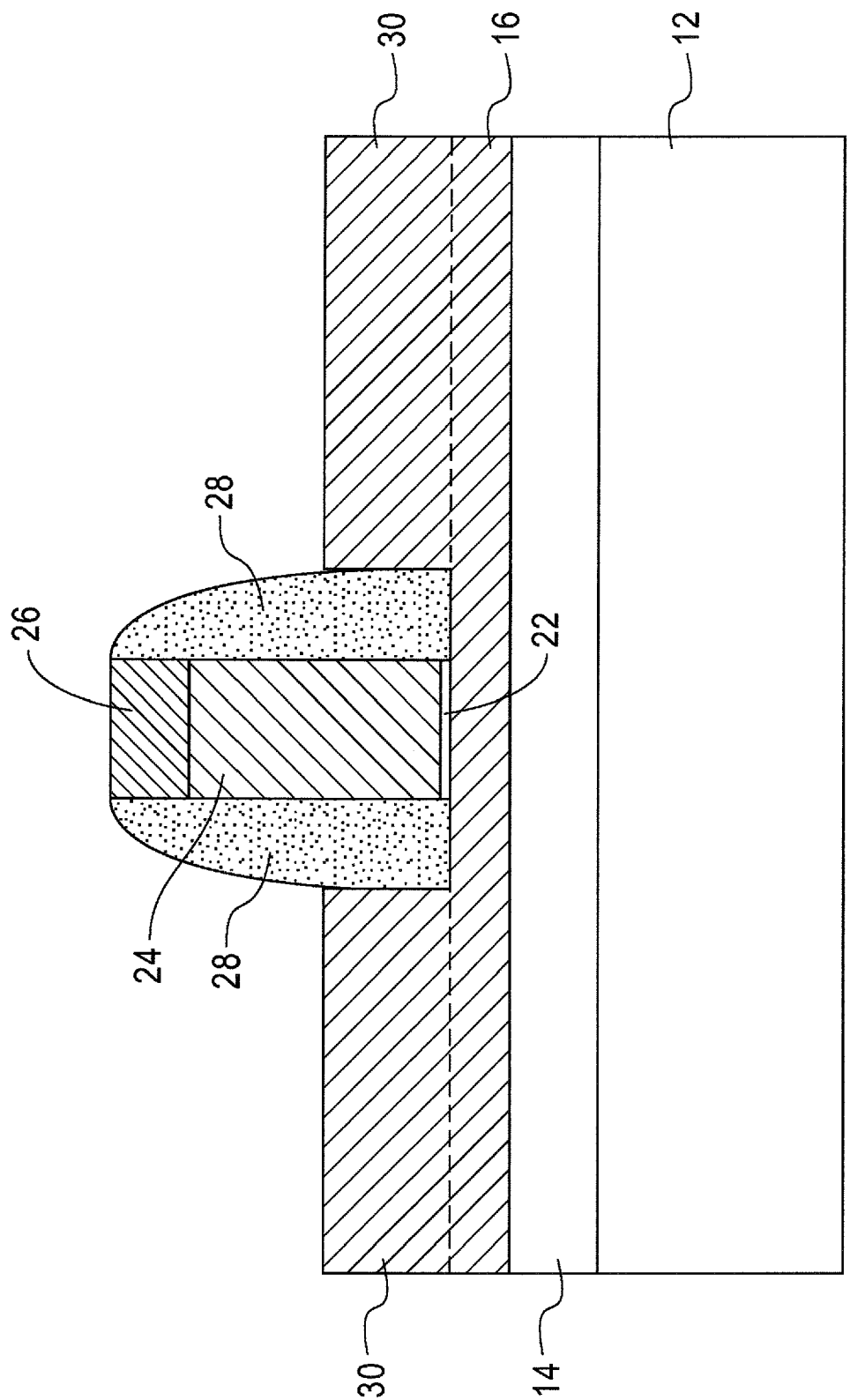

FIG. 5 illustrates the structure that is formed after forming the RSD region 30 on a first portion of the UTSOI that is not covered by the disposable spacer 28. The RSD region 30 is formed by epitaxial growth of semiconductor material atop the UTSOI layer 16. Typically, but not necessarily always, the semiconductor material of the RSD region 30 is of the same type as that of the UTSOI layer 16. In FIG. 5, a dotted line is shown to illustrate that the RSD region 30 is formed atop the UTSOI layer 16. The epitaxial growth process used in forming the RSD region 30 is well known to those skilled in the art and as such details concerning the epitaxial growth process have also been omitted so as not to obscure the present invention.

Source/drain (S/D) dopants may optionally be introduced into the RSD region 30 at this time of the inventive method or they may be introduced later on after formation of the extension regions. If the S/D dopants are introduced at this point of the inventive method, an in-situ doping process can be used or dopants can be introduced after epitaxial growth of the RSD region 30. The S/D dopants may be p-type dopants (an element from Group IIIA of the Periodic Table f Elements) or the dopants may be n-type dopants (an element from Group VA of the Periodic Table of Elements). An anneal step that activates and diffuses the S/D dopants is then optionally performed; the activation and diffusion of the S/D dopants can be performed in a later step of the inventive method as well. The anneal step may include a furnace anneal, a laser anneal, a rapid thermal anneal, a spike anneal or a microwave anneal. Typically, the annealing step is a rapid thermal anneal that is performed at a temperature of greater than 900° C. for a time period of less than 15 seconds.

Figure 6:
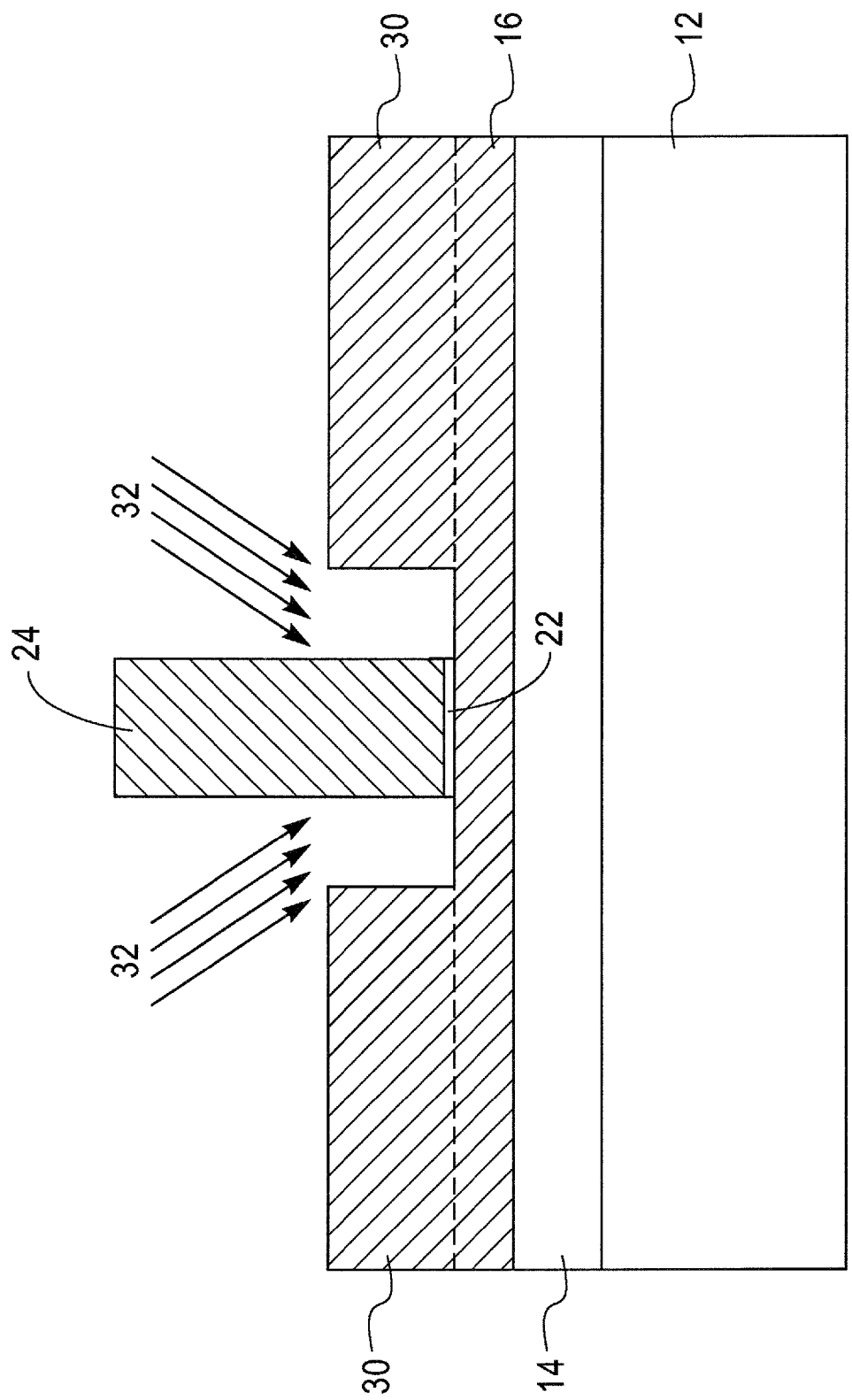
Figure 7:
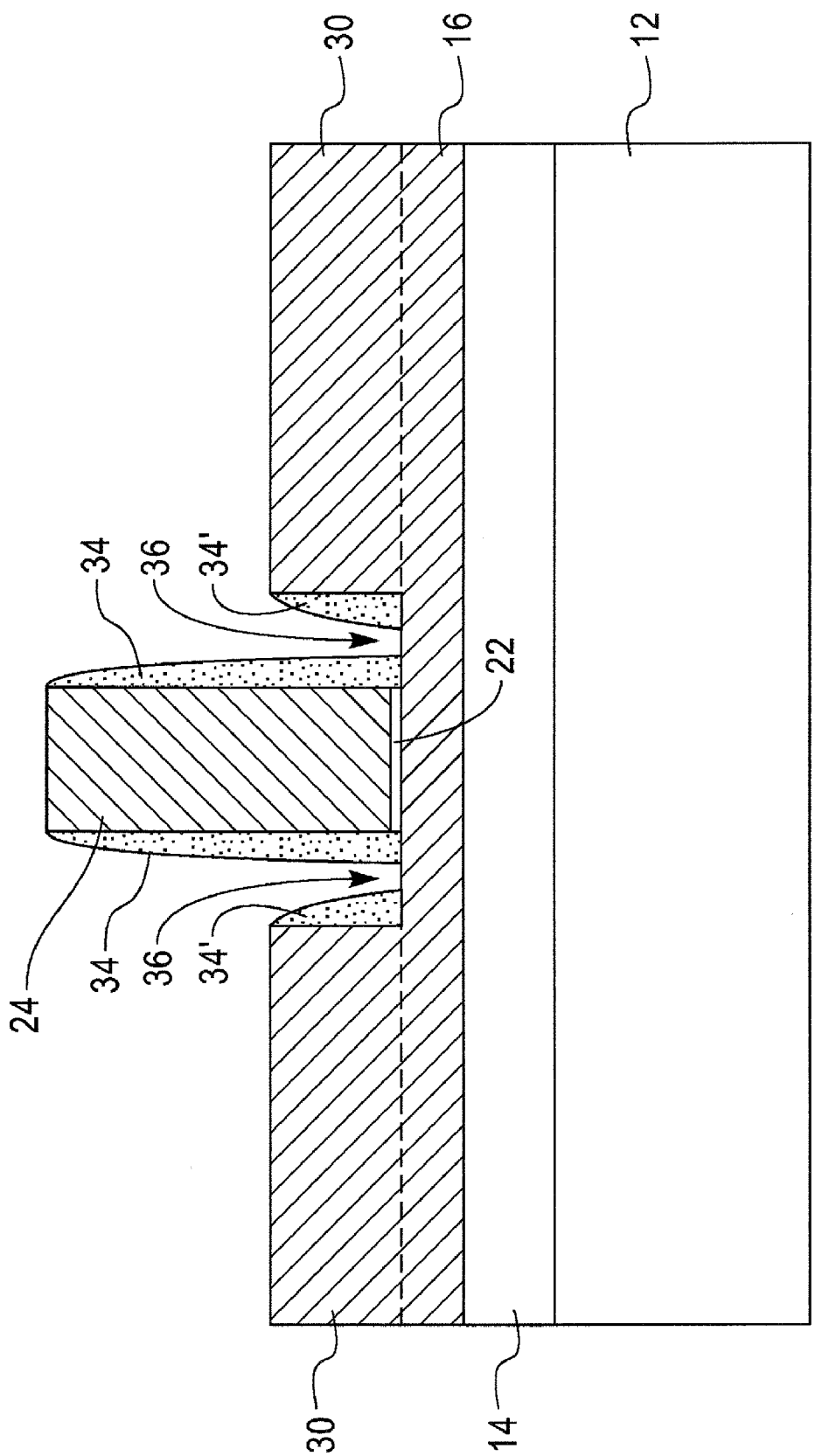

FIG. 6 shows the structure after removing the disposable spacer 28 there from. The disposable spacer 28 is removed utilizing an etching process that selectively removes the disposable spacer 28. When the disposable spacer 28 and the hard mask 26 are comprised of the same material, both the disposable spacer 28 and the hard mask 26 are removed as is the case illustrated in FIG. 6. The removal of the disposable spacer 28 exposes a second portion of the UTSOI layer 16 which is located at the footprint of the remaining patterned gate region.

With the disposable spacer 28 removed, a halo implantation (represented by reference numeral 32 in FIG. 6) is then performed. The halo implant employed is an angled ion implantation (angle of implantation of from about 30 to about 45°) in which a halo ion such as boron (B) or arsenic (As) is introduced into exposed second portion of the UTSOI layer 16 which is located at the footprint of the remaining patterned gate stack. Unlike prior art processes, the halo implant occurs in the present invention immediately after the disposable spacer 28 has been removed; in the prior art processes the halo doping typically occurs after the formation of offset spacers and at the same time as that of the extension implant. Also unlike prior art processes in which high halo implant doses are employed, the present invention can perform the halo implant at much less dosage.

Typically, the B dosage for prior art processes is within the range from about $1.2\times10^{14}$ to about $1.5\times10^{14}$ atoms/cm$^2$, while in the present invention the B dosage is about $1\times10^{14}$ atoms/cm$^2$ or less, with a dosage from about $4\times10^{13}$ to about $8\times10^{13}$ atoms/cm$^2$ being more highly preferred. The energy used in the inventive method during halo implantation of B is typically from about 5 to about 25 keV.

When As is employed, the As dosage for prior art processes is within the range from about $7\times10^{13}$ to about $1\times10^{14}$ atoms/cm$^2$, while in the present invention the As dosage is about $5\times10^{13}$ atoms/cm$^2$ or less, with a dosage from about $2\times10^{13}$ to about $4\times10^{13}$ atoms/cm$^2$ being more highly preferred. The energy used in the inventive method during halo implantation of As is typically from about 5 to about 25 keV.

The effect of performing the halo implantation at this stage of the process rather than latter on in the process is that more halo doping can be achieved under the patterned gate region. Typically, in the present invention, the halo concentration of B under the patterned gate region is about $3\times10^{18}$ atoms/cm$^3$ or greater, with a range from about $5\times10^{18}$ to about $1\times10^{19}$ atoms/cm$^3$ being even more typical. When As is used, the halo concentration of As under the patterned gate region is about $3\times10^{18}$ atoms/cm$^3$ or greater, with a range from about $4\times10^{18}$ to about $8\times10^{8}$ atoms/cm$^3$ being even more typical.

In some embodiments of the present invention, a very high angled halo implant (angle of greater than 45°) can be performed. This embodiment is used when the UTSOI layer 16 has a thickness of about 20 nm or less. In such an embodiment, the halo dosage can be decreased about 30% from those reported above for the inventive halo implant, and a thinner implantation mask can be used.

An annealing step may optionally be performed to activate the halo implant region at this point of the present invention.

After performing the halo doping, an offset spacer 34 is formed on vertical sidewalls of the remaining patterned gate stack and a corresponding offset spacer 34' is also formed on the exposed vertical sidewalls of the RSD region 30. See, the structure shown in FIG. 7. The spacers 34 and 34' are formed by deposition and reactive ion etching. The spacers 34 and 34' are comprised of one of the materials mentioned above for disposable spacer 28. The width of the offset spacer 34, as measured from the bottom surface that abuts the UTSOI layer 16, is from about 3 nm to about 20 nm. The width of the offset spacer 34 determines the lateral distance that the halo implant region will be spaced apart from the extension implant region.

An extension implant 36 (See, FIG. 7 as well) is then performed utilizing a conventional extension implantation process well known to those skilled in the art. By way of illustration, the following extension implantations may be performed: For an extension region including As: dosage 1.6E13 atoms/cm$^2$, energy 2 keV, angle of implant 7°. For an extension region including B: dosage of BF$_2$ ions 7E14 atoms/cm$^2$, energy 3 keV, angle 7°.

An annealing step may optionally be performed to activate the halo implant and extension implant regions at this point of the present invention. If the halo implant region was previously activated then the anneal performed at this stage of the inventive method only activates the extension implant region.

It is noted that all the angles mentioned herein in connection with the various implantations is incident upon the vertical sidewalls of the remaining patterned gate stack.

Figure 8:
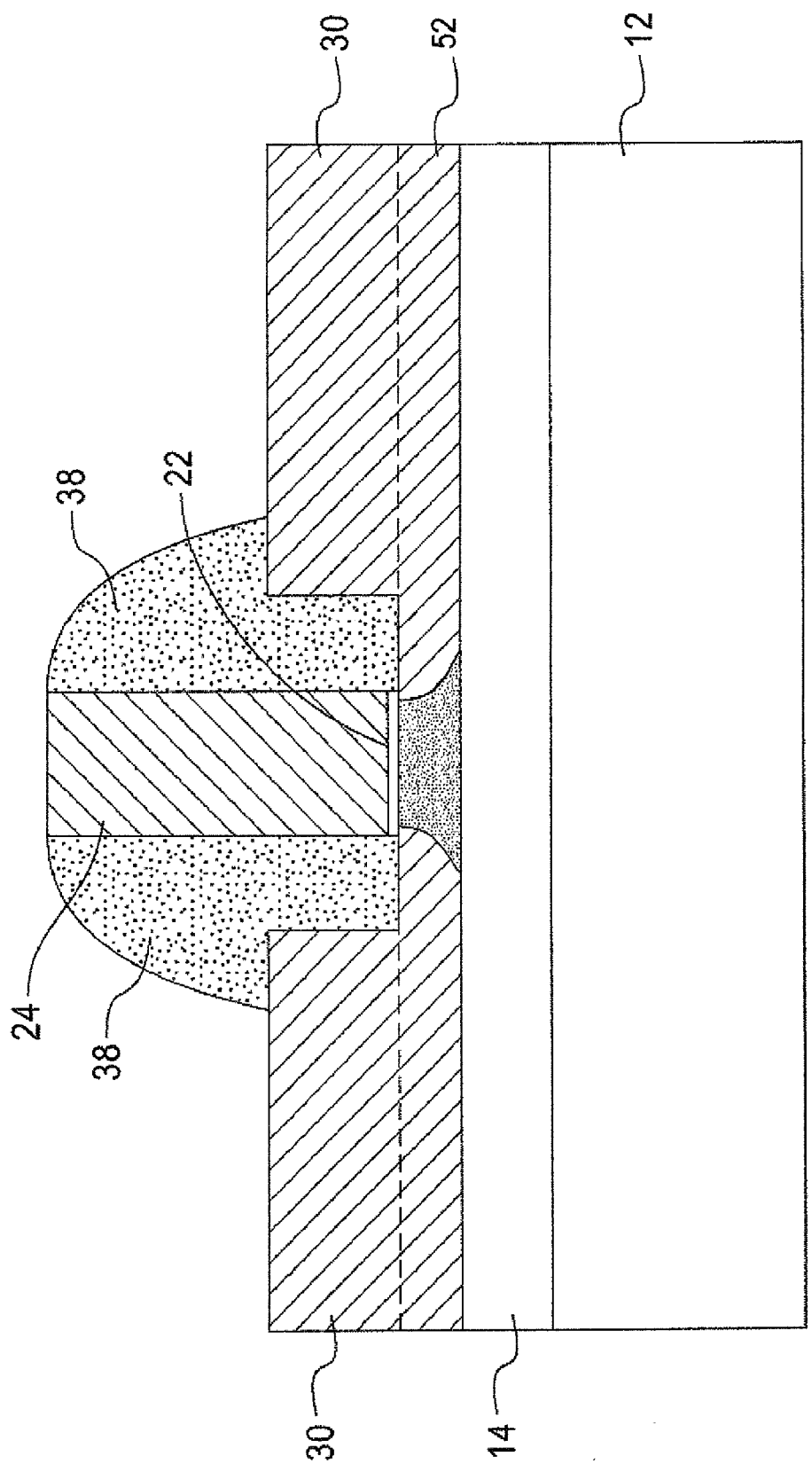

The offset spacers 34 and 34' are then removed from the structure and a silicide spacer 38 is formed on the now exposed vertical sidewalls of the remaining patterned gate stack providing the structure shown in FIG. 8. The silicide spacer 38 is comprised of silicon and a metal that is capable of reacting with silicon to form a silicide. Examples of such metals include Ti, Co, W, Ni and Pt. Typically, the silicide spacer 38 includes one of Ti, Co and Ni. The silicide spacer 38 is formed utilizing a conventional silicidation process well known to those skilled in the art including deposition of a layer of silicon, followed by deposition of one of the above mentioned metals that can react with silicon, and thereafter a silicide anneal is performed to cause said reaction. After silicide formation, reactive ion etching is used to form the silicide spacer 38.

If not previous performed, the S/D dopants can be introduced in the RSD region 30 at this point of the present invention and then annealed as described above can be performed.

Figure 9:
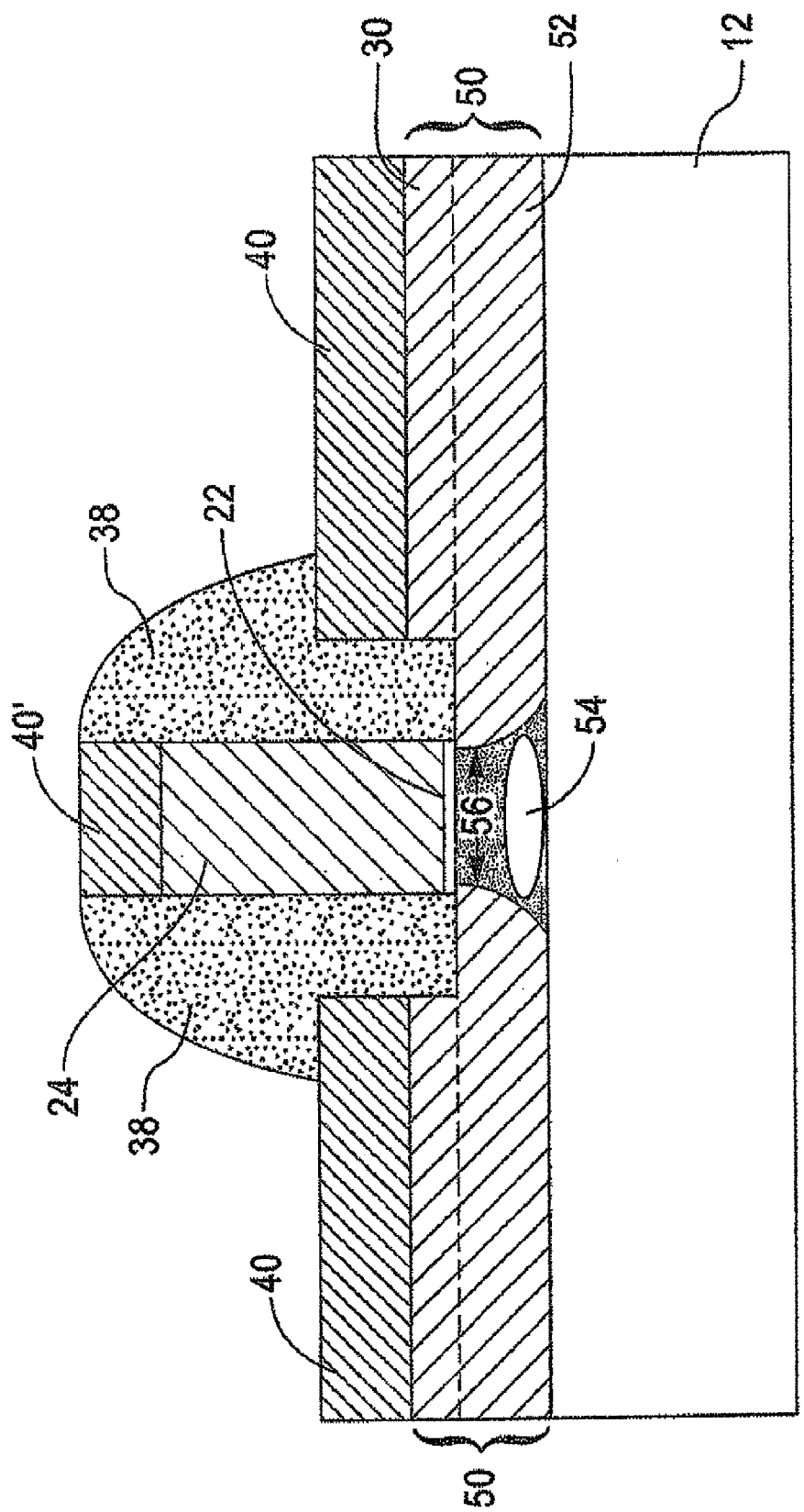

FIG. 9 shows the resultant structure after forming a silicide region 40 atop the exposed RSD region 30 and optionally a silicide region 40' atop the exposed gate conductor 26. The silicide regions 40 and 40' are formed utilizing the same basic processing steps are described above for formation of the silicide spacer 38 except that a reactive ion etching step is not used.

In the resultant structure shown in FIG. 9, reference numeral 50 denotes the source/drain regions, reference numeral 52 denotes the extension region, reference numeral 54 denotes the halo region and reference numeral 56 denotes the device channel. It is noted that after the source/drain anneal, the halo moves in from both sides to peak in the middle of the target channel length of the FET and the extensions move in under the offset spacer.

FIG. 9 thus shows a semiconductor structure comprising at least one patterned gate region (represented by layers 22 and 24) located upon a surface of an ultra-thin semiconductor-on-insulator (UTSOI) layer 16, said UTSOI layer 16 having a first portion that includes a raised source/drain region 30 located thereon and a second portion in which an extension ion implant region 52, a halo implant region 54 and a device channel 56 are located. The halo implant region 54 and the extension implant region 52 are laterally separated from each other at implant by a distance from about 3 to about 20 nm thereby minimizing counter-doping in said extension implant region.

The following example illustrates some advantages of the present method over that of a conventional prior art process.

Example

In this example, an nFET was prepared in accordance with the method of the present invention (i.e., halo before offset spacer formation; Example 1) and was compared to an nFET prepared in accordance with a prior art process in which the halo implant was performed after offset spacer formation and at the same time as that of the extension implantation (Comparative Example). The following conditions for halo implant were used: Example 1: $6\times10^{13}$ Boron, 30 degrees, 25 keV, Comparative Example $1\times10^{14}$ Boron, 30 degrees, 25 keV.

Figure 10A:
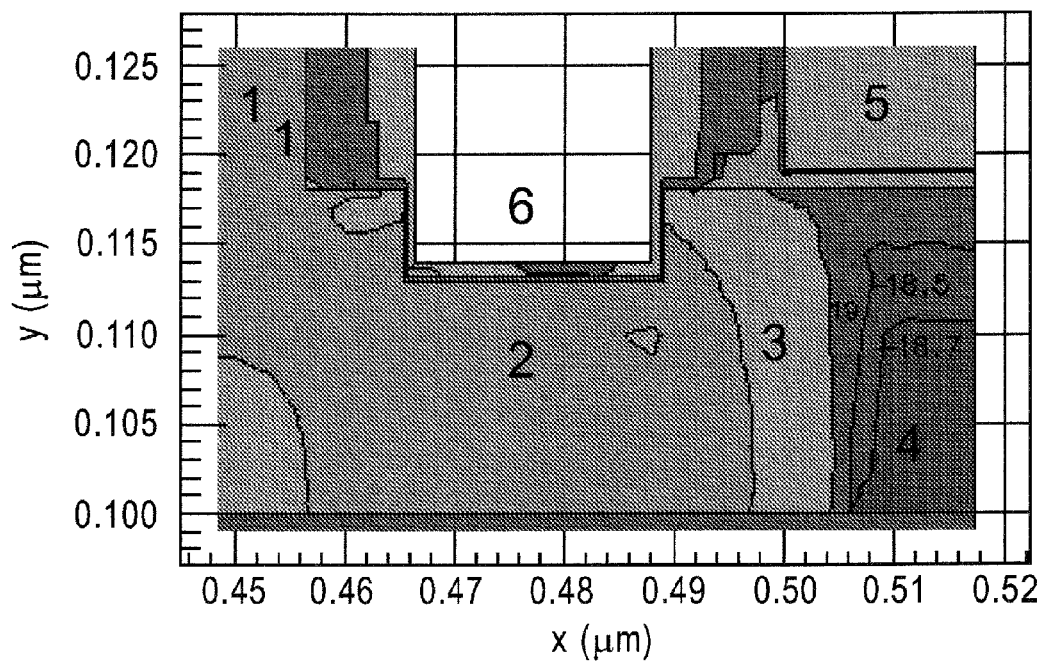
FIGS. 10A and 10B illustrate two-dimensional (2D) doping profiles for the inventive method (Example 1) and the prior art method (Comparative Example), respectively.
Figure 10B:
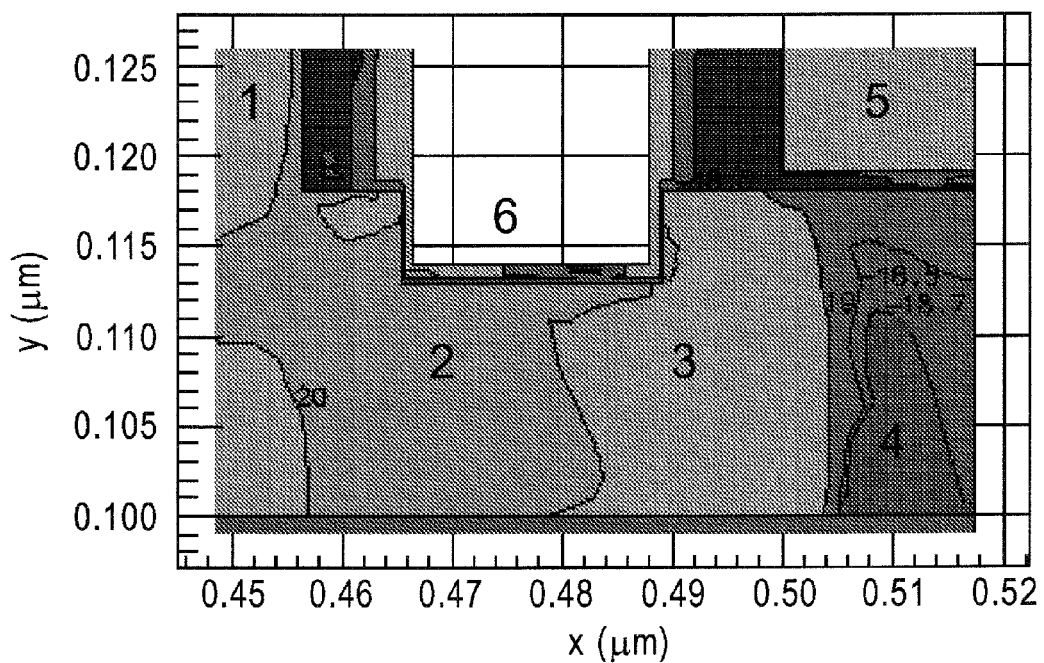

Reference is made to FIGS. 10A and 10B which illustrate a 2D doping profile for the inventive method (Example 1) and the prior art method (Comparative Example), respectively. The device silicon film thickness is 18 nm. Example 1 is shown in FIG. 10A and the Comparative Example is shown in FIG. 10B. Region 1 is the location of the raised source/drain. Region 2 is the extension doped region where the disposable spacer had previously been (leading to the ~5 nm of recess in the silicon located in region 6). The doping concentration in region 2 exceeds $1\times10^{20}$ atoms/cm$^3$. Region 3 is the extension doped region extending under the poly-silicon gate (region 4). The doping concentration in region 3 exceeds $1\times10^{19}$ atoms/cm$^3$ but is lower than $1\times10^{20}$ atoms/cm$^3$. Region 4 shows the halo doped are under the channel. Therefore, this illustration shows half of the total device, from source to midway through the gate. The key feature of the invention is that the higher doped extension region (region 2) has much greater extent in Example 1 in FIG. 10A versus the Comparative Example in FIG. 10B, leading to much lower parasitic resistance to the device channel. Also, similar halo profiles (region 4) are achieved in both devices, but using 30% lower halo dose in FIG. 10A.

Figure 11:
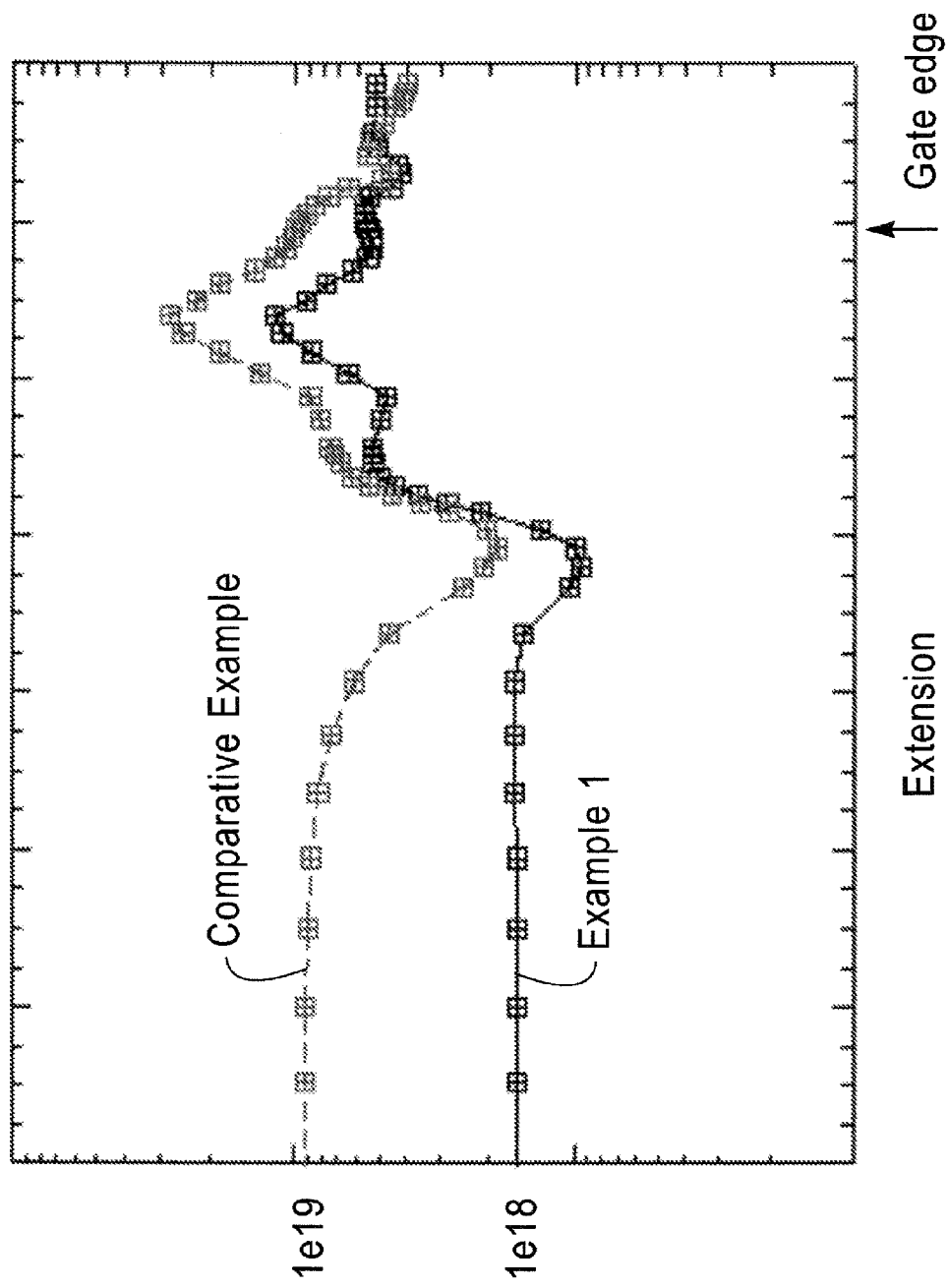
FIG. 11 shows one-dimensional (1D) nFET p-doping profiles for the inventive method (Example 1) and the prior art method (Comparative Example).
Figure 12:
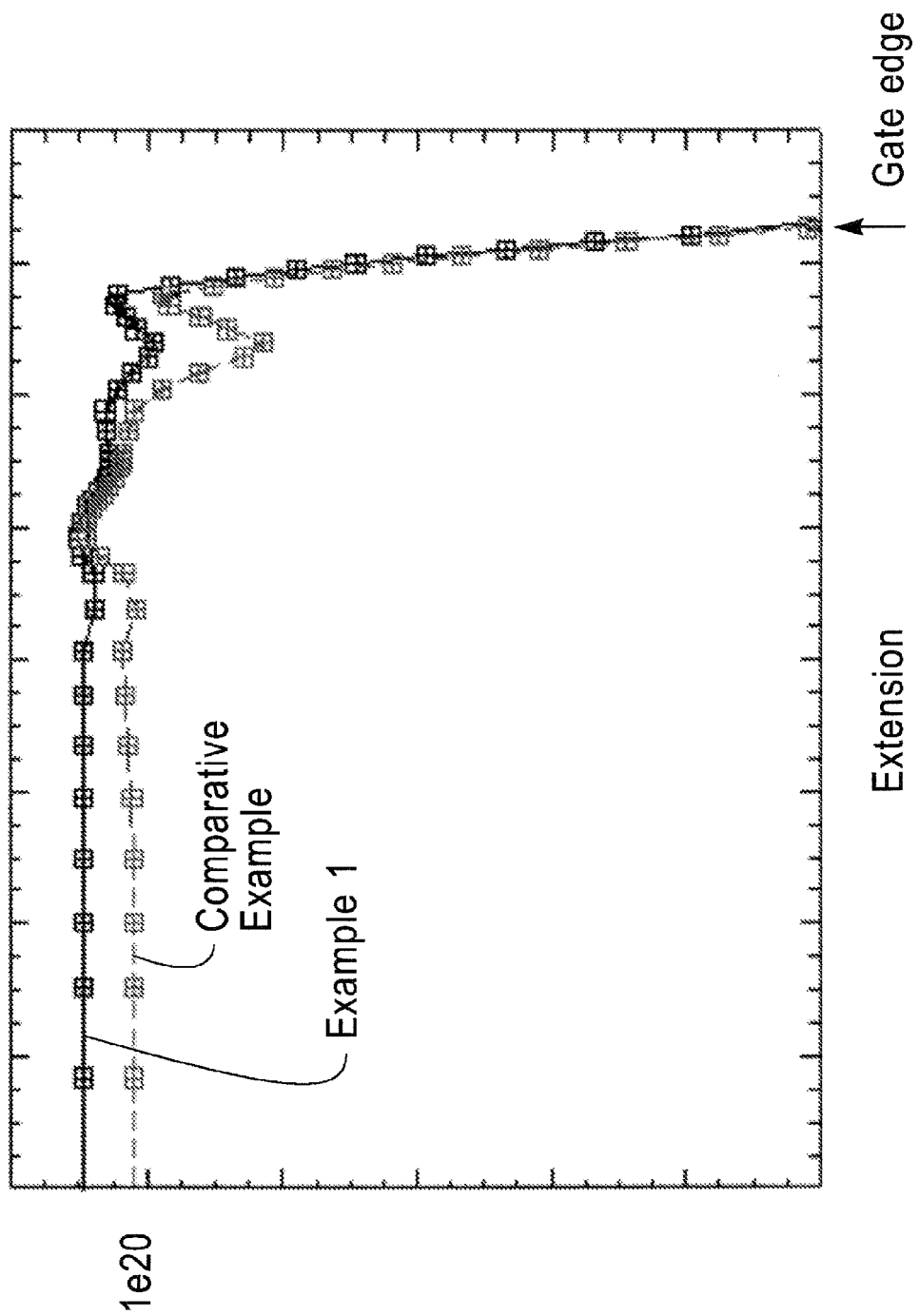
FIG. 12 shows 1D nFET net doping profiles for the inventive method (Example 1) and the prior art method (Comparative Example).

Reference is now made to the 1D doping profiles shown in FIG. 11 (nFET p-doping) and FIG. 12 (nFET net n-doping) which include data for Example 1 and the Comparative Example. In FIG. 11, note that the P type doping in the extension region in Example 1 is one decade lower ($1\times10^{18}$ atoms/cm$^3$ versus $1\times10^{19}$ atoms/cm$^3$) which will lead to significantly less counterdoping of the N-type extension region. This is further illustrated in FIG. 12, which shows the total n-doping profile, show higher net n-doping concentration in the extension region in Example 1 versus the Comparative Example ($2\times10^{20}$ atoms/cm$^3$ versus $1\times10^{20}$ atoms/cm$^3$) and less n-doping loss near the gate edge, which is a critical region for resistance to the channel.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed as new is:

1. A semiconductor structure comprising:
at least one patterned gate region located upon a surface of an ultra-thin semiconductor-on-insulator (UTSOI) layer, said UTSOI layer having a first portion that includes a a raised source/drain region located thereon and a second portion in which an extension ion implant region, a halo implant region and a device channel are located, said halo implant region and said extension implant region are laterally separated from each other by a distance from about 3 to about 20 nm thereby minimizing counter-doping in said extension implant region.

2. The semiconductor structure of claim 1 wherein said UTSOI layer is located atop a buried insulating layer.

3. The semiconductor structure of claim 1 wherein said UTSOI layer and said raised source/drain region are comprised of the same semiconductor material.

4. The semiconductor structure of claim 1 further comprising a silicide region located on a surface of said raised source/drain region.

5. The semiconductor structure of claim 1 wherein said patterned gate stack further includes a silicide region located atop a polysilicon gate conductor.

6. The semiconductor structure of claim 1 wherein said halo implant region comprises boron ions in a concentration from about $3\times10^{18}$ atoms/cm$^3$ or greater.

7. The semiconductor structure of claim 1 wherein said halo implant region comprises arsenic ions in a concentration from about $3\times10^{18}$ atoms/cm$^3$ or greater.

8. The semiconductor structure of claim 1 wherein said UTSOI layer has a thickness of less than 20 nm.

9. The semiconductor structure of claim 1 further comprising a gate passivation layer located on a portion of vertical sidewalls of said at least one patterned gate stack.

* * * * *